US012813143B2

(12) United States Patent
Ye et al.

(10) Patent No.: US 12,813,143 B2
(45) Date of Patent: Nov. 24, 2026

(54) WINDOW AND DISPLAY DEVICE INCLUDING THE SAME

(71) Applicant: Samsung Display Co., LTD., Yongin-si (KR)

(72) Inventors: Byoung Dae Ye, Yongin-si (KR); Su-Hyoung Kang, Yongin-si (KR); Myung-Seok Kwon, Yongin-si (KR); Jae Sul An, Yongin-si (KR); Juyoung Yoon, Yongin-si (KR); Jaewoo Im, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 416 days.

(21) Appl. No.: 18/200,963

(22) Filed: May 23, 2023

(65) Prior Publication Data

US 2024/0081132 A1 Mar. 7, 2024

(30) Foreign Application Priority Data

Sep. 7, 2022 (KR) ........................ 10-2022-0113474

(51) Int. Cl.

*H10K 59/80* (2023.01)
*G02B 1/14* (2015.01)
*H10K 102/00* (2023.01)

(52) U.S. Cl.

CPC ............. *H10K 59/879* (2023.02); *G02B 1/14* (2015.01); *H10K 2102/311* (2023.02)

(58) Field of Classification Search

CPC ........... H10K 59/879; H10K 2102/311; G02B 1/111; G02B 1/11; B32B 17/10018

See application file for complete search history.

(56) References Cited

U.S. PATENT DOCUMENTS

| | | | | |
|---|---|---|---|---|
| 8,249,409 | B2 | 8/2012 | Zhang et al. | |
| 10,222,510 | B2 | 3/2019 | Song et al. | |
| 2007/0178311 | A1* | 8/2007 | Akagi | B29C 48/154 427/407.1 |
| 2016/0177147 | A1* | 6/2016 | Han | C09J 7/22 428/220 |
| 2021/0278568 | A1* | 9/2021 | Yanagawa | G02B 5/0268 |
| 2023/0174826 | A1* | 6/2023 | Pang | C09J 7/385 359/507 |

FOREIGN PATENT DOCUMENTS

| | | | | |
|---|---|---|---|---|
| EP | 4006592 A1 * | 6/2022 | | G02B 1/11 |
| JP | 7299631 B2 * | 6/2023 | | B32B 7/12 |
| KR | 100551135 B1 | 2/2006 | | |
| KR | 101611650 B1 | 4/2016 | | |
| KR | 101953775 B1 | 3/2019 | | |

* cited by examiner

*Primary Examiner* — Alia Sabur

(74) *Attorney, Agent, or Firm* — CANTOR COLBURN LLP

(57) ABSTRACT

A window includes a window base layer, a high refractive layer disposed on the window base layer, a low refractive layer including hollow silica particles and disposed on the high refractive layer, and a primer coating layer disposed on the low refractive layer. Each of the low refractive layer and the primer coating layer has a refractive index in a range of about 1.4 to about 1.46. The low refractive layer has a thickness in a range of about 50 nm to about 80 nm.

17 Claims, 5 Drawing Sheets

WINDOW AND DISPLAY DEVICE INCLUDING THE SAME

This application claims priority to Korean Patent Application No. 10-2022-0113474, filed on Sep. 7, 2022, and all the benefits accruing therefrom under 35 U.S.C. § 119, the content of which in its entirety is herein incorporated by reference.

BACKGROUND

1. Field

The disclosure herein relates to a window and a display device including the window, and more particularly, to a window having low reflection characteristics, high abrasion resistance characteristics and high chemical resistance characteristics, and a display device including the window.

2. Description of the Related Art

A display device is used in various multimedia devices such as a television, a mobile phone, a tablet computer, and a game console to provide image information to a user. Recently, various types of flexible display devices which are foldable or bendable are being developed. A flexible display device may include a foldable or bendable display panel and a window.

SUMMARY

A window included in a display device is designed so that image information provided from a display panel can be effectively transmitted to an outside. Specifically, the window may be desired to have low reflection characteristics to prevent image quality degradation due to reflection of external light incident on the display device from the outside. In addition, the window may be desired to protect the display panel. In particular, a portable display device may be desired to have durability against external shock, friction, and abrasion caused by a user's input.

The present disclosure provides a window having low reflection characteristics and high abrasion resistance and chemical resistance characteristics.

The present disclosure also provides a display device including a window having low reflection characteristics and high abrasion resistance and chemical resistance characteristics.

An embodiment of the invention provides a window including: a window base layer; a high refractive layer disposed on the window base layer; a low refractive layer including hollow silica particles and disposed on the high refractive layer; and a primer coating layer disposed on the low refractive layer, where each of the low refractive layer and the primer coating layer has a refractive index in a range of about 1.4 to about 1.46.

In an embodiment, the primer coating layer may include a silane coupling agent.

In an embodiment, the primer coating layer may have a thickness in a range of about 10 nanometers (nm) to about 40 nm.

In an embodiment, the hollow silica particles may have a size in a range of about 50 nm to about 80 nm.

In an embodiment, the low refractive layer may further include a binder, and a content of the hollow silica particles may be in a range of about 60 weight percent (wt %) to about 100 wt % with respect to a total content of the low refractive layer.

In an embodiment, the low refractive layer may have a thickness in a range of about 50 nm to about 80 nm.

In an embodiment, the high refractive layer may have a thickness in a range of about 50 nm to about 120 nm.

In an embodiment, the high refractive layer may have a refractive index in a range of about 1.67 to about 1.7.

In an embodiment, the window may further include an anti-fingerprint layer disposed on the primer coating layer.

In an embodiment, the anti-fingerprint layer may be disposed directly on the primer coating layer.

In an embodiment, the anti-fingerprint layer may include perfluoropolyether (PFPE).

In an embodiment, the window may further include a hard coating layer disposed between the window base layer and the high refractive layer.

In an embodiment of the invention, a window including: a window base layer; a high refractive layer disposed on the window base layer; a low refractive layer including hollow silica particles and disposed on the high refractive layer; and a primer coating layer disposed on the low refractive layer, where the low refractive layer has a thickness in a range of about 50 nm to about 80 nm.

In an embodiment, the primer coating layer may include a silane coupling agent.

In an embodiment, the high refractive layer may have a refractive index in a range of about 1.67 to about 1.7, and each of the low refractive layer and the primer coating layer may have a refractive index in a range of about 1.4 to about 1.46.

In an embodiment, the primer coating layer may have a thickness in a range of about 10 nm to about 40 nm, and the high refractive layer may have a thickness in a range of about 50 nm to about 120 nm.

In an embodiment, the window may further include an anti-fingerprint layer disposed directly on the primer coating layer.

In an embodiment of the invention, a display device comprising: a display module including a display panel and a sensor layer disposed on the display panel; and a window disposed on the display module, where the window includes a window base layer, a high refractive layer disposed on the window base layer; a low refractive layer including hollow silica particles and disposed on the high refractive layer; and a primer coating layer disposed on the low refractive layer, and each of the low refractive layer and the primer coating layer has a refractive index in a range of about 1.4 to about 1.46.

In an embodiment, the primer coating layer may include a silane coupling agent, and the primer coating layer may have a thickness in a range of about 10 nm to about 40 nm.

In an embodiment, the low refractive layer may have a thickness in a range of about 50 nm to about 80 nm, and the high refractive layer may have a thickness in a range of about 50 nm to about 120 nm.

BRIEF DESCRIPTION OF THE DRAWINGS

The above and other features of the invention will become more apparent by describing in further detail embodiments thereof with reference to the accompanying drawings, in which.

DETAILED DESCRIPTION

Figure 1:
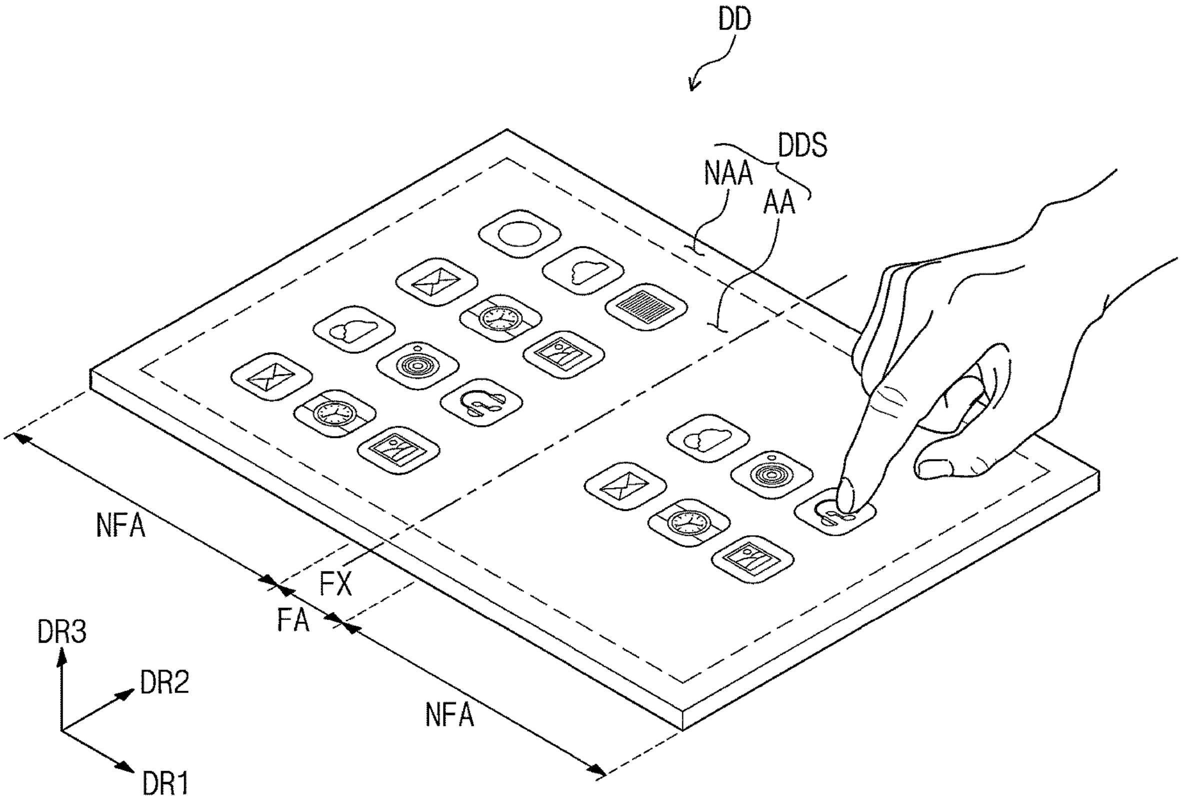
FIG. 1 is a combined perspective view of a display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element (or a region, a layer, a portion, or the like) is referred to as "being on", "connected to" or "coupled to" another element, it can be directly disposed on, connected or coupled to the other element, or intervening elements may be disposed therebetween.

In the present application, "directly disposed" means that there is no additional layer, film, region, plate, or the like added between the portion of the layer, film, region. For example, "directly disposed" may mean disposing without additional members such as adhesive members between two layers or two members.

Like reference numerals or symbols refer to like elements throughout. Also, in the drawings, the thicknesses, ratios, and dimensions of the elements are exaggerated for effective description of the technical contents.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

Although the terms first, second, etc. may be used to describe various elements, these elements should not be limited by these terms. These terms are only used to distinguish one element from another element. For example, a first element may be referred to as a second element, and similarly, a second element may also be referred to as a first element without departing from the scope of the present disclosure. The singular forms include the plural forms as well, unless the context clearly indicates otherwise.

Also, relative terms, such as "below", "lower", "above", "upper", or the like may be used to describe the relationships of the elements illustrated in the drawings. These terms have relative concepts and are described on the basis of the directions indicated in the drawings. In this specification, being "disposed on" may represent not only being disposed on a top surface but also being disposed on a bottom surface.

It will be understood that the term "includes" or "comprises", when used in this specification, specifies the presence of stated features, integers, steps, operations, elements, components, or a combination thereof, but does not preclude the presence or addition of one or more other features, integers, steps, operations, elements, components, or combinations thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which the present disclosure belongs. Also, terms, such as those defined in commonly used dictionaries, should be interpreted as having a meaning that is consistent with their meaning in the context of the relevant art and should not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a window and a display device according to embodiments of the invention will be described with reference to the drawings.

Figure 2:
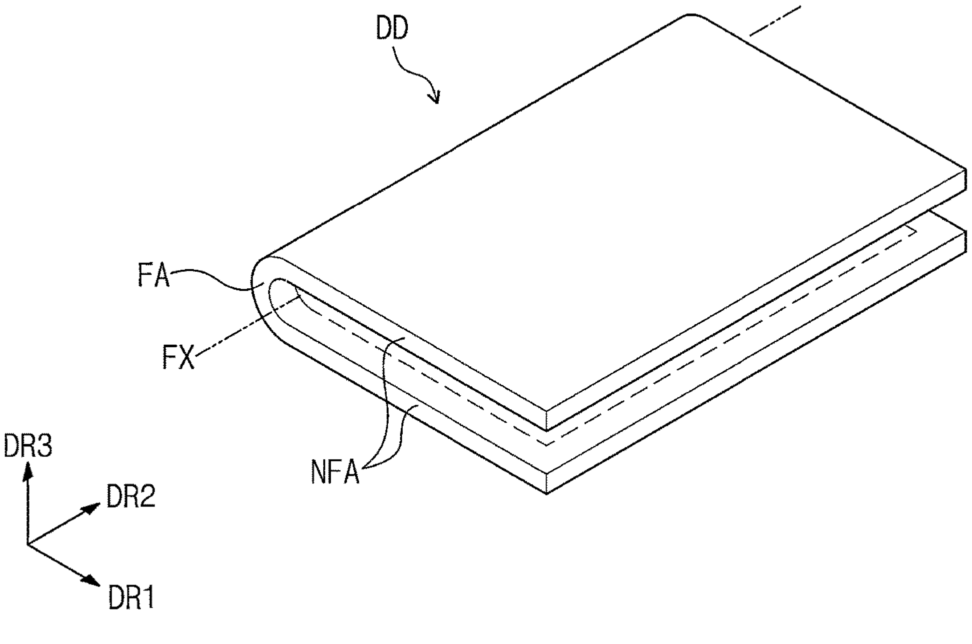
FIG. 2 is a diagram illustrating a display device in a folded state according to an embodiment of the invention.

FIG. 1 is a perspective view of a display device DD according to an embodiment of the invention. FIG. 2 is a diagram illustrating a folded state of the display device DD according to an embodiment of the invention.

An embodiment of a display device DD illustrated in FIG. 1 may be a device activated in response to an electrical signal. In an embodiment, for example, the display device DD may be a mobile phone, a tablet computer, a monitor, a television, a car navigation system, a game machine, or a wearable device, but an embodiment of the invention is not limited thereto. FIG. 1 exemplarily illustrates an embodiment where the display device DD is a mobile phone.

The display device ED according to an embodiment may display an image through an active region AA. The active region AA may be on a plane defined by a first direction DR1 and a second direction DR2. Although not illustrated, the active region AA may further include a curved surface that bends from at least one side of the plane defined by the first direction DR1 and the second direction DR2.

A display surface DDS of the display device DD according to an embodiment may include the active region AA and a peripheral region NAA adjacent to the active region AA.

The peripheral region NAA may surround the active region AA. Accordingly, the shape of the active region AA may be defined substantially by the peripheral region NAA entirely surrounding the active region AA. However, this is illustrated as an example, and the peripheral region NAA may be disposed adjacent to only one side of the transmission region AA or may be omitted. The display device DD according to an embodiment of the invention may have active regions AA with various shapes, and is not limited to any one embodiment.

Here, in FIG. 1 and the following drawings, a first direction DR1 to a third direction DR3 are illustrated. However, the directions indicated by the first to third directions DR1, DR2, and DR3 illustrated herein may have a relative concept and thus be changed to other directions.

In this specification, the first direction DR1 is perpendicular to the second direction DR2, and the third direction DR3 may be a normal direction of the plane defined by the first direction DR1 and the second direction DR2.

A thickness direction of the display device DD may be parallel to a third direction DR3 that is the normal direction of the plane defined by the first direction DR1 and the second direction DR2. In this specification, a front surface (or an upper surface) and a rear surface (or a lower surface) of each member constituting the display device DD may be defined with respect to the third direction DR3.

In this specification, the phrase "on a plane" may mean viewed on a plane parallel to the plane defined by the first direction DR1 and the second direction DR2 or viewed in the third direction DR3. In this specification, the term "overlapping" may mean overlapping when viewed on the plane or in the third direction DR3 unless otherwise specified.

FIG. 2 illustrates the display device DD illustrated in FIG. 1 in a folded state. Referring to FIGS. 1 and 2, the display device DD according to an embodiment may include a folding region FA and a non-folding region NFA. The display device DD may include a folding region FA and a plurality of non-folding regions NFA.

The folding region FA may be disposed between the non-folding regions NFA, and the folding region FA and the non-folding regions NFA may be arranged adjacent to each other in the first direction DR1. The folding region FA may be a deformable region in a folded form with respect to the folding axis FX extending in one direction, that is, the second direction DR2.

In FIGS. 1 and 2, embodiments including one folding region FA and two non-folding regions NFA are exemplarily illustrated, but the number of folding regions FA and non-folding regions NFA are not limited thereto. In an alternative embodiment, for example, the display device DD may include more than two non-folding regions NFA and a plurality of folding regions FA disposed between the non-folding regions NFA.

In the display device DD according to an embodiment, the non-folding regions NFA may be disposed symmetrically with respect to the folding region FA. However, an embodiment of the invention is not limited thereto, and areas of the two non-folding regions NFA facing each other with respect to the folding region FA may be different from each other.

Referring to FIG. 2, an embodiment of the display device DD may be a foldable display device DD that is folded or unfolded. In such an embodiment of the display device DD, for example, the folding region FA may be a region that is folded with respect to the folding axis FX parallel to the second direction DR2.

When the display device DD is folded, the display device may be in-folded so that the non-folding regions NFA may face each other and the display surface DDS of the display device DD may not be exposed to the outside. However, an embodiment of the invention is not limited thereto, and alternatively, the display device may be out-folded so that the display surface DDS of the display device DD is exposed to the outside.

Figure 3:
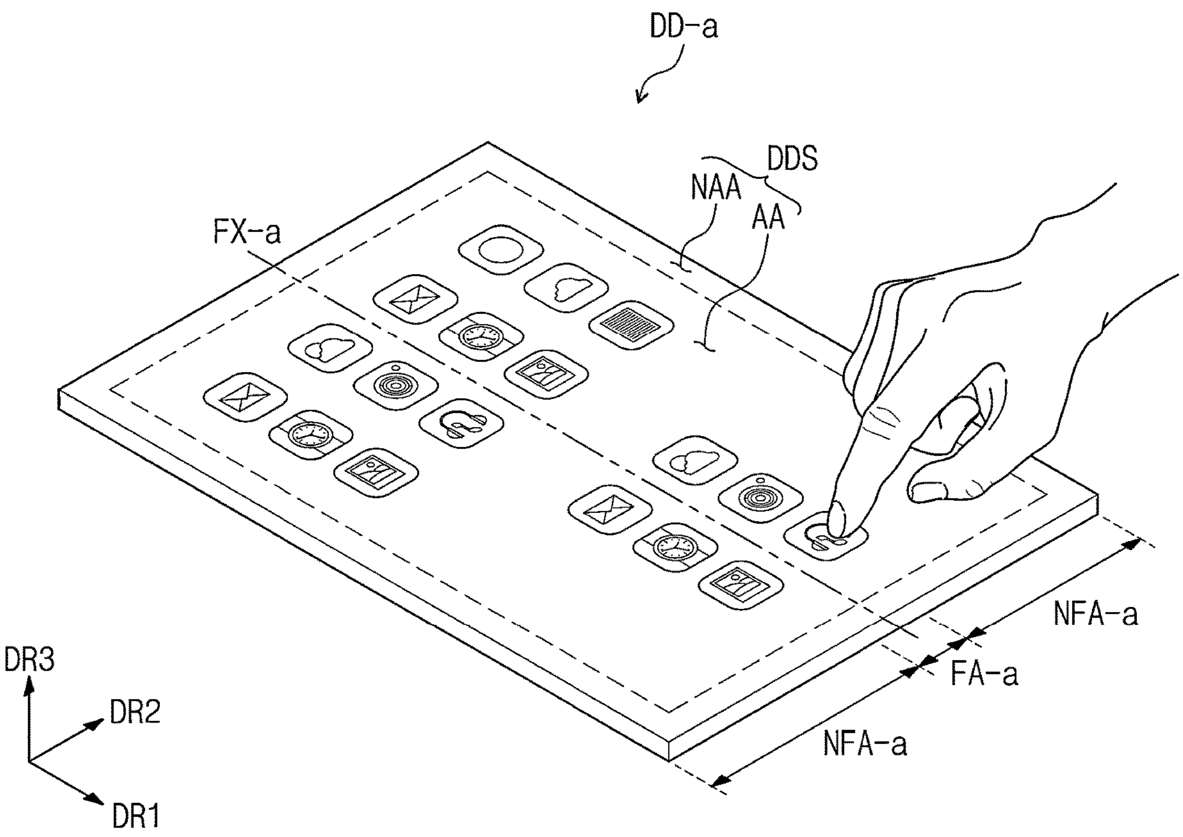
FIG. 3 is a combined perspective view of a display device according to an embodiment of the invention.
Figure 4:
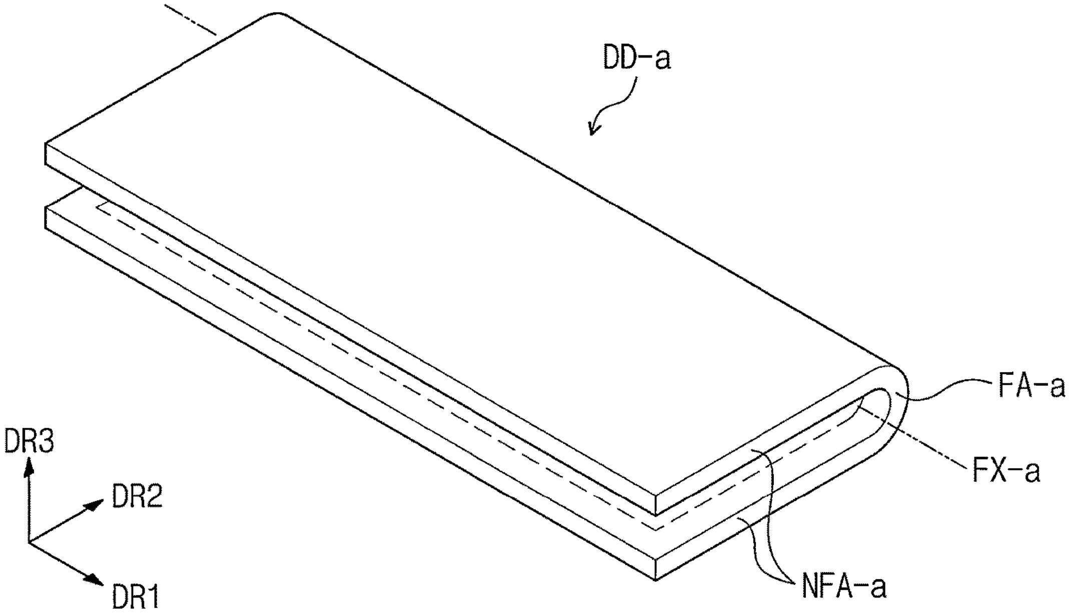
FIG. 4 is a diagram illustrating a display device in a folded state according to an embodiment of the invention.

FIG. 3 is a combined perspective view of a display device DD-a according to an embodiment of the invention. FIG. 4 is a diagram illustrating a display device DD-a in a folded state according to an embodiment of the invention.

The display device DD-a illustrated in FIG. 3 may have substantially the same configuration as the display device DD illustrated in FIG. 1 except for a folding operation. Accordingly, in the description of the display device DD-a illustrated in FIGS. 3 and 4, the folding operation will be mainly described below.

Referring to FIGS. 3 and 4, the display device DD-a according to an embodiment may include a folding region FA-a and a non-folding region NFA-a. The display device DD-a may include a folding region FA-a and a plurality of non-folding regions NFA-a.

The folding region FA-a may be disposed between the non-folding regions NFA-a, and the folding region FA-a and the non-folding region NFA-a may be arranged adjacent to each other in the second direction DR2. The folding region FA-a may be a deformable region in a folded form with respect to a folding axis FX-a extending in one direction, that is, the first direction DR1.

In the display device DD-a according to an embodiment, the non-folding regions NFA-a may be symmetrically disposed with respect to the folding region FA-a. However, an embodiment of the invention is not limited thereto, and areas of the two non-folding regions NFA-a facing each other with respect to the folding region FA-a may be different from each other.

When the display device DD-a is folded, the display device may be in-folded so that the non-folding regions NFA-a may face each other and the display surface DDS of the display device DD-a may not be exposed to the outside. However, an embodiment of the invention is not limited thereto, and alternatively, the display device may be out-folded such that the display surface DDS of the display device DD-a is exposed to the outside.

Hereinafter, for convenience of description, an embodiment of the display device DD having the folding axis FX in the second direction DR2 as shown in FIG. 1 will be mainly described in detail. However, an embodiment of the invention is not limited thereto, and for example, the following description may also be similarly applied to an embodiment of the display device DD-a having the folding axis FX-a in the first direction DR1 as shown in FIG. 3.

Figure 5:
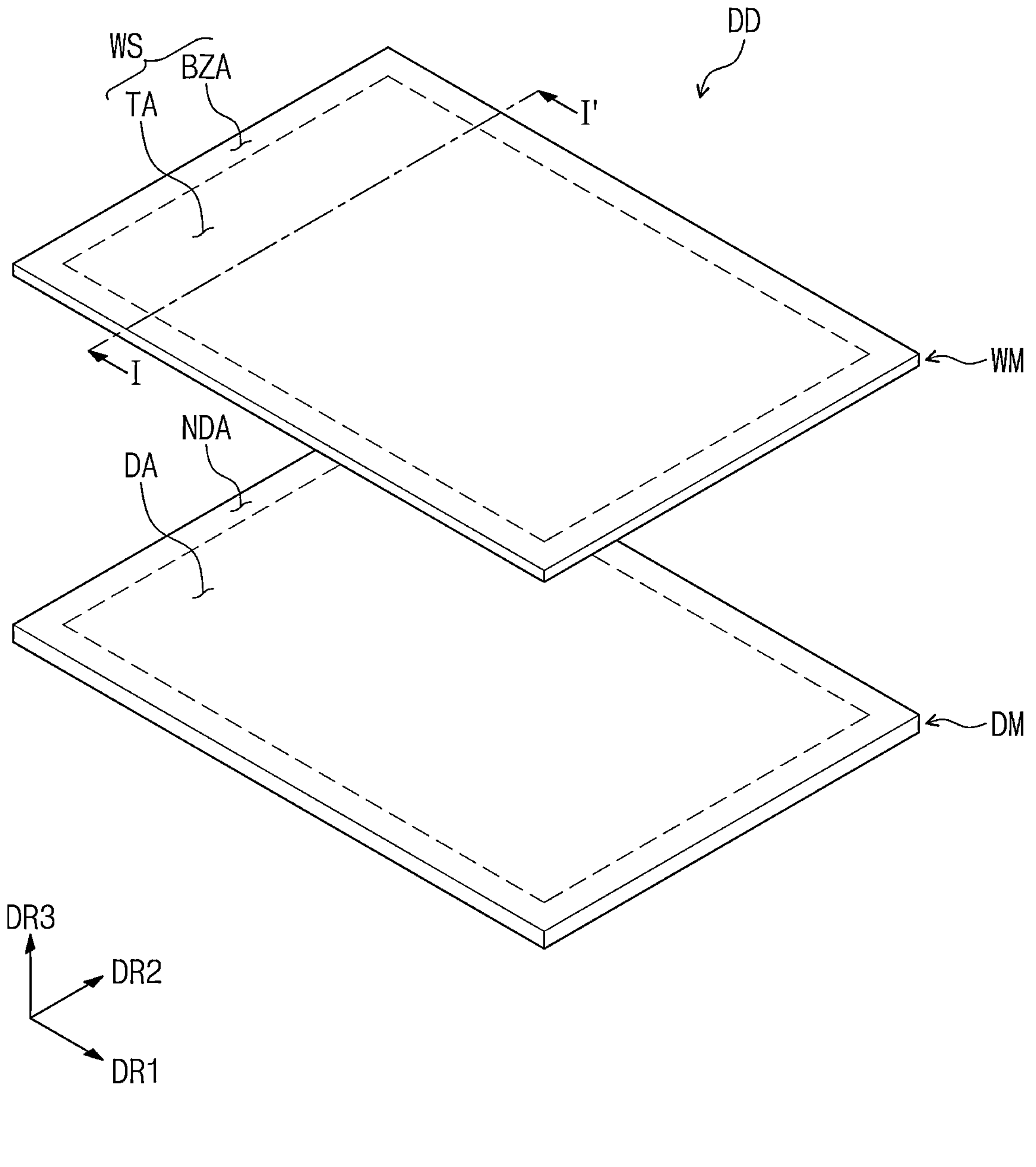
FIG. 5 is an exploded perspective view of a display device according to an embodiment of the invention.
Figure 6:
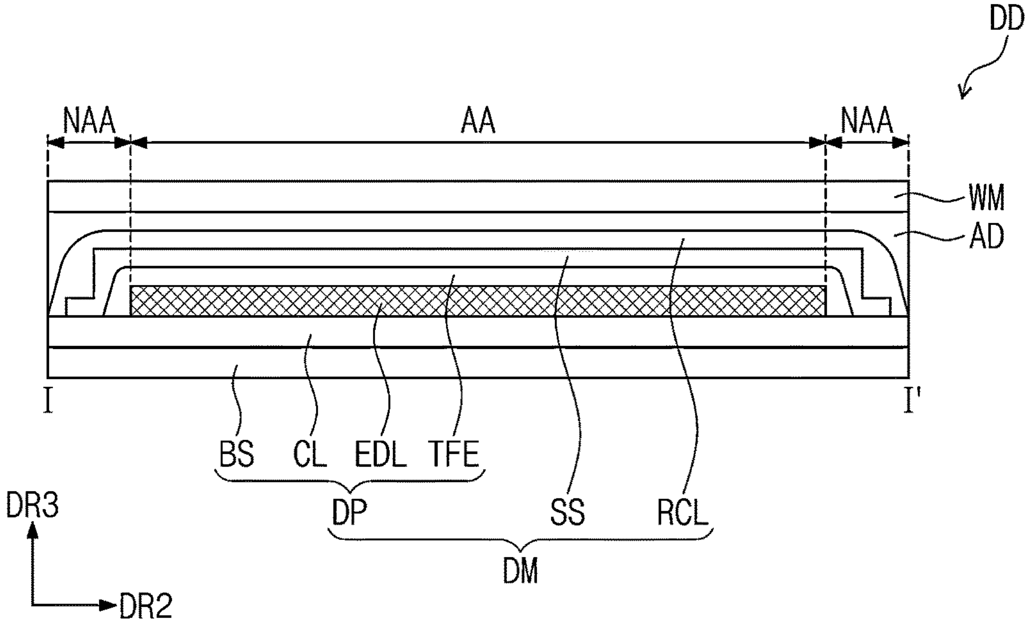
FIG. 6 is a cross-sectional view of a portion of a display device according to an embodiment of the invention.

FIG. 5 is an exploded perspective view of a display device according to an embodiment of the invention. FIG. 6 is a cross-sectional view of a portion of a display device according to an embodiment of the invention. An adhesive layer is omitted in FIG. 5 for convenience of illustration, and FIG. 6 illustrates the adhesive layer AD disposed between the window WM and the display module DM.

The display device DD according to an embodiment includes a display module DM. The display module DM may be a component that generates an image and senses an input applied from the outside.

Referring to FIG. 5, in an embodiment, a display region DA and a non-display region NDA may be defined in the display module DM. The display region DA may be a region which is activated in response to an electrical signal. The display region DA may correspond to the active region AA of FIG. 1. The non-display region NDA may be a region positioned adjacent to at least one side of the display region AA. The non-display region NDA may correspond to the peripheral region NAA of FIG. 1. A driving circuit, a driving line or the like for driving the display region DA may be disposed in the non-display region NDA.

FIG. 5 illustrates an embodiment where the window WM and the display module DM have a same size as each other, but an embodiment of the invention is not limited thereto. In an alternative embodiment, for example, the size of the window WM may be smaller than the size of the display module DM, or the size of the window WM may be larger than the size of the display module DM.

FIG. 6 may be a cross-sectional view taken along line I-I' of FIG. 5. The display module DM according to an embodiment includes a display panel DP.

In an embodiment, the display panel DP may substantially be a component that generates an image. The display panel DP may be a light-emitting display panel. In an embodiment, for example, the display panel DP may be an organic light-emitting display panel, an inorganic light-emitting display panel, a quantum dot display panel, a micro light-emitting diode (LED) display panel, or a nano LED display panel. Hereinafter, for convenience of description, an embodiment where the display panel DP is an organic light-emitting display panel will be described in detail.

The display module DM according to an embodiment may further include a sensor layer SS disposed on the display panel DP, and an optical layer RCL disposed on the sensor layer SS. However, an embodiment of the invention is not limited thereto, and the sensor layer SS or the optical layer RCL may be omitted.

Referring to FIG. 6, the display panel DP may include a base layer BS, a circuit layer CL, a light-emitting element layer EDL, and an encapsulation layer TFE.

The base layer BS may be a member that provides a base surface on which a circuit layer CL is disposed. The base layer BS may be a rigid substrate or a flexible substrate capable of bending, folding, rolling, or the like. The base layer BS may be a glass substrate, a metal substrate, or a polymer substrate. However, an embodiment of the invention is not limited thereto, and the base layer BS may be an inorganic layer, an organic layer, or a composite material layer.

The circuit layer CL may be disposed on the base layer BS. The circuit layer CL may include an insulating layer, a semiconductor pattern, a conductive pattern, a signal line, or the like. In an embodiment, the insulating layer, a semiconductor layer, and a conductive layer are formed on the base layer through coating, deposition, etc., and subsequently, the insulating layer, the semiconductor layer, and the conductive layer may be selectively patterned by performing a photolithography process and etching process multiple times. Then, the semiconductor pattern, the conductive pattern, and the signal line which are included in the circuit layer CL may be formed.

The light-emitting element layer EDL may be disposed on the circuit layer CL. The light-emitting element layer EDL may include a light-emitting element. In an embodiment, for example, the light-emitting element may include an organic light-emitting material, an inorganic light-emitting material, an organic-inorganic light-emitting material, a quantum dot, a quantum rod, a micro LED, or a nano LED. The light-emitting element layer EDL may further include an organic layer in addition to the light-emitting element. In an embodiment, for example, the light-emitting element layer EDL may further include a pixel defining film, a hole control layer, an electron control layer, or the like. In an embodiment, for example, the hole control layer may include at least one of a hole injection layer, a hole transport layer, or an electron blocking layer. In an embodiment, for example, the electron control layer may include at least one of a hole blocking layer, an electron transport layer, or an electron injection layer.

The encapsulation layer TFE may be disposed on the light-emitting element layer EDL. The encapsulation layer TFE may cover the light-emitting element layer EDL. The encapsulation layer TFE may be disposed in the active region AA in which the light-emitting element layer EDL is disposed, and may be disposed to extend to the peripheral region NAA in which the light-emitting element layer EDL is not disposed. The encapsulation layer TFE may protect the light-emitting element layer EDL from foreign substances such as moisture, oxygen, and dust particles.

The sensor layer SS may be disposed on the display panel DP. The sensor layer SS may sense an external input applied from the outside. The external input may be a user's input. The user's input may include various types of external inputs such as a portion of the user's body, light, heat, a pen, or pressure.

In an embodiment, the sensor layer SS may be formed on the display panel DP through a continuous process. In such an embodiment, the sensor layer SS may be disposed directly on the display panel DP. In this specification, "disposed directly" may mean that a third component is not disposed between the sensor layer SS and the display panel DP. That is, a separate adhesive member may not be disposed between the sensor layer SS and the display panel DP. In an embodiment, for example, the sensor layer SS may be disposed directly on the encapsulation layer TFE of the display panel DP. Alternatively, the sensor layer SS may be coupled to the display panel DP through an adhesive member. The adhesive member may include a typical adhesive or bonding agent.

The optical layer RCL may be disposed on the sensor layer SS. The optical layer RCL may be disposed directly on the sensor layer SS. In an embodiment, the optical layer RCL may be formed on the sensor layer SS through a continuous process. The optical layer RCL may reduce the reflectance of external light which is incident from the outside. The optical layer RCL may include a polarization layer or a color filter layer. In an alternative embodiment, the optical layer RCL may be omitted.

In an alternative embodiment of the invention, the sensor layer SS may be omitted. In such an embodiment, the optical layer RCL may be disposed directly on the display panel DP. In an embodiment, the positions of the sensor layer SS and the optical layer RCL may be interchanged.

The display device DD according to an embodiment of the invention may further include a window WM disposed on the display module DM. The window WM may have a shape corresponding to the shape of the display module DM. The window WM may cover an entire outer surface of the display module DM. The window WM may be coupled to the display module DM through the adhesive layer AD.

In the display device DD according to an embodiment, the window WM may include an optically transparent material. The window WM may include an insulating material. In an embodiment, for example, the window WM may include or be composed of glass, plastic, or a combination thereof.

A front surface WS of the window WM of FIG. 5 may be a portion corresponding to the display surface DDS of the display device DD of FIG. 1. The front surface WS of the window WM may include a transmission region TA and a bezel region BZA adjacent to the transmission region TA. The transmission region TA may correspond to the active region AA, and the bezel region BZA may correspond to the peripheral region NAA.

The transmission region TA may be an optically transparent region. In an embodiment, for example, the transmission region TA may be a region having a visible light transmittance of about 90% or higher. The bezel region BZA may be a region having a relatively lower light transmittance than the transmission region TA. The bezel region BZA defines the shape of the transmission region TA. The bezel region BZA may be adjacent to the transmission region TA and may surround the transmission region TA.

The bezel region BZA may have a predetermined color. The bezel region BZA may cover the non-display region NDA of the display module DM and may block the non-display region NDA from being viewed from the outside. However, this is merely illustrated as an example, and the bezel region BZA may be omitted in the window WM according to an alternative embodiment of the invention.

Figure 7:
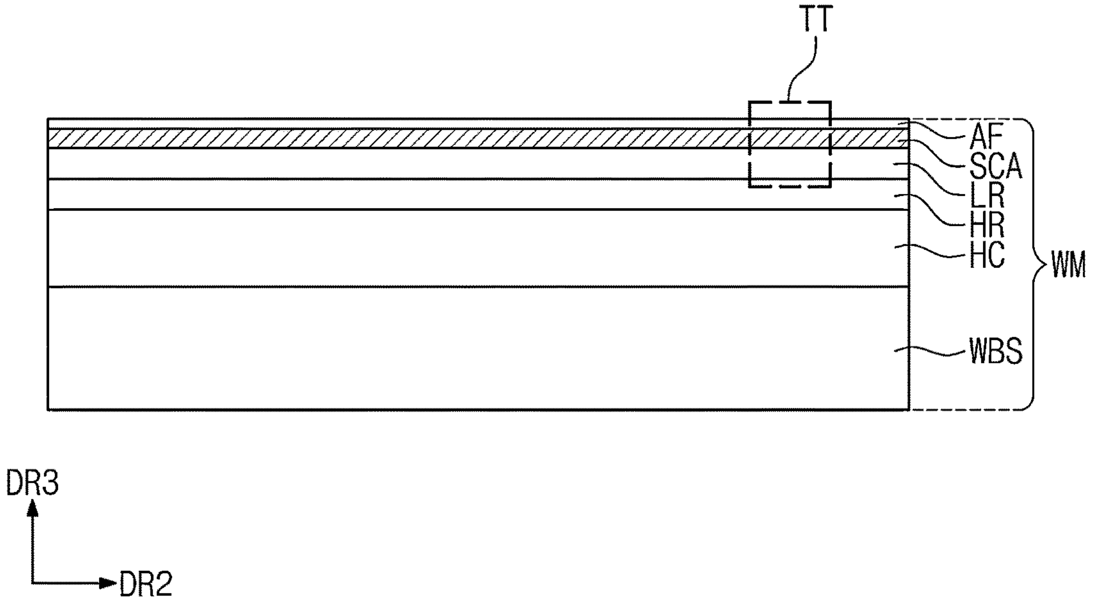
FIG. 7 is a cross-sectional view of a portion of a window according to an embodiment of the invention.
Figure 8:
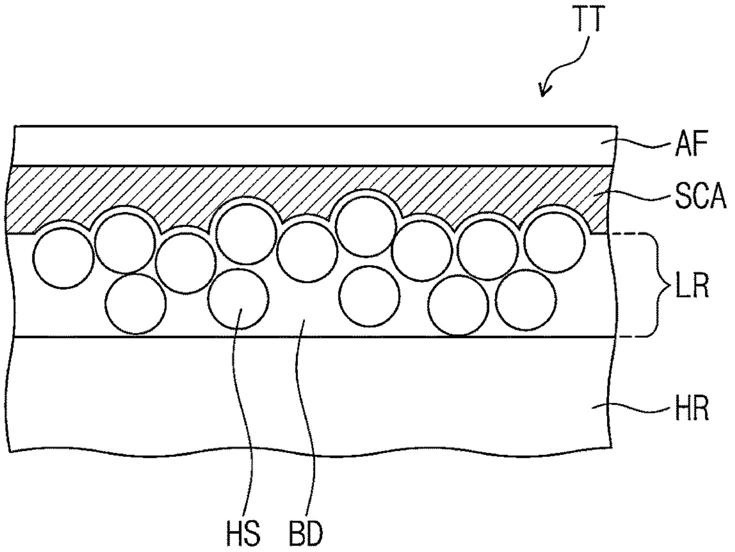
FIG. 8 is an enlarged cross-sectional view of a portion of a window according to an embodiment of the invention.

FIG. 7 is a cross-sectional view of a portion of a window WM according to an embodiment of the invention. FIG. 8 is an enlarged cross-sectional view of a portion of a window WM according to an embodiment of the invention.

Referring to FIG. 7, the window WM according to an embodiment may include a window base layer WBS, a hard coating layer HC disposed on the window base layer WBS, a high refractive layer HR disposed on the hard coating layer HC, a low refractive layer LR disposed on the high refractive layer HR, a primer coating layer SCA disposed on the low refractive layer LR, and an anti-fingerprint layer AF disposed on the primer coating layer SCA.

The window base layer WBS may function as a support layer in the window WM. The window base layer WBS may include a transparent material. The window base layer WBS may include glass, tempered glass, or a polymer film. The window base layer WBS may be a chemically strengthened glass substrate.

In an embodiment where the window base layer WBS is a chemically strengthened glass substrate, the window base layer may have a thin thickness and high mechanical strength, and thus may be used as a window of a foldable display device.

In an embodiment where the window base layer WBS contains a polymer film, the window base layer WBS may include a polyimide (PI) film or a polyethylene terephthalate (PET) film.

The window base layer WBS may have a thickness in a range of about 20 micrometers (μm) to about 70 μm. In an embodiment, for example, the window base layer WBS may have a thickness in a range of about 10 μm to about 50 μm. However, an embodiment of the invention is not limited thereto.

The high refractive layer HR may have a relatively high refractive index compared to the low refractive layer LR. The high refractive layer HR may have a refractive index in a range of about 1.67 to about 2.0, for example, in a range of about 1.67 to about 1.7. The high refractive layer HR may have a thickness in a range of about 50 nanometers (nm) to about 120 nm.

The high refractive layer HR may include inorganic fine particles and a binder resin. The inorganic fine particles may be metal oxide fine particles. The metal oxide fine particles may be, for example, oxide fine particle of at least one metal selected from Zr, Ti, In, Zn, Sn, Al, and Sb. The binder resin may include a monomer or oligomer having a photocurable functional group. The refractive index of the high refractive layer HR may be adjusted by changing the ratio of the inorganic fine particles and the binder resin.

FIG. 8 is an enlarged view of a portion TT illustrated in FIG. 7. FIG. 8 illustrates hollow silica particles HS and a binder BD included in the low refractive layer LR, which will be described later.

In an embodiment, the low refractive layer LR may have a refractive index in a range of about 1.4 to about 1.46. The low refractive layer LR may include inorganic fine particles, and the inorganic fine particles may be hollow silica particles HS. The hollow silica particles HS may be silica particles derived from a silicon compound or an organosilicon compound, and may refer to particles having empty spaces inside the silica particles. The hollow silica particles HS may have a size (e.g., an average width or an average diameter) in a range of, for example, about 50 nm to about 80 nm. The low refractive layer LR may include the hollow silica particles HS, and thus have a low refractive index in the above range.

The low refractive layer LR may further include the binder BD. The binder BD may be a silane coupling agent. The silane coupling agent may mean a compound that has, on one side of Si, a reactive group capable of bonding with an organic material described later and has, on another side thereof, a reactive group capable of bonding with an inorganic material. In an embodiment, for example, the reactive group capable of bonding with the organic material may include a vinyl group, an epoxy group, an amino group, or a methacrylic group. In addition, the reactive group capable of bonding with the inorganic material may include a methoxy group, an ethoxy group, or the like.

With respect to a total weight of the low refractive layer LR, the hollow silica particles HS may have a weight ratio of about 60% to about 100%. That is, a content of the low refractive layer LR may be in a range of about 60 weight percent (wt %) to about 100 wt % with respect to a total content of the low refractive layer LR. The refractive index of the low refractive layer LR may be adjusted by changing the weight ratio (or the content) of the hollow silica particles HS.

The low refractive layer LR may have a thickness in a range of about 50 nm to about 80 nm. Generally, a window may include the primer coating layer SCA to be described later, and thus have an increased window thickness, resulting an increase in the reflectance of the window compared to a case where the window may include only the low refractive layer LR. The window WM (see FIG. 7) according to an embodiment of the invention may include the primer coating layer SCA to be described later, and the low refractive layer LR may have a thickness in a range of about 50 nm to about 80 nm, thereby improving reflectance.

The primer coating layer SCA may be applied on (or disposed to cover) the low refractive layer LR and may planarize irregularities caused by the hollow silica particles HS of the low refractive layer LR, that is provide a planarized surface on the hollow silica particles HS of the low refractive layer LR. FIG. 8 illustrates an embodiment where the upper surface of the low refractive layer LR has the irregularities caused by the hollow silica particles HS and is planarized by the primer coating layer SCA. Accordingly, adhesion between the low refractive layer LR and the anti-fingerprint layer AF, which will be described later, may be improved.

The primer coating layer SCA may include a silane coupling agent. The above description of the binder BD of the low refractive layer LR may be similarly applied to the silane coupling agent. The silane coupling agent of the primer coating layer SCA serves to strengthen the adhesion between the low refractive layer LR and the anti-fingerprint layer AF, which will be described later. Accordingly, the window WM including the primer coating layer SCA may exhibit high abrasion resistance characteristics and high chemical resistance characteristics.

The primer coating layer SCA may have a thickness in a range of about 10 nm to about 40 nm. In such an embodiment where the primer coating layer SCA has a thickness in the above range, the irregularities of the low refractive layer LR may be substantially planarized and low reflection characteristics may be effectively maintained.

The primer coating layer SCA may have a refractive index in a range of about 1.4 to about 1.46. That is, as the refractive index of the primer coating layer SCA becomes more similar to the refractive index of the low refractive layer LR, the low reflection characteristic may be further improved.

The anti-fingerprint layer AF may be disposed on the uppermost layer of the window WM. The anti-fingerprint layer AF may prevent fingerprints from being formed thereon and suppress abrasion caused by external friction.

In an embodiment, the anti-fingerprint layer AF may be disposed directly on the primer coating layer SCA. As described above, adhesion between the low refractive layer LR and the anti-fingerprint layer AF may be improved by the primer coating layer SCA. Accordingly, the display device may exhibit high abrasion resistance characteristics and high chemical resistance characteristics.

The anti-fingerprint layer AF may include a polymer containing fluorine. In an embodiment, the anti-fingerprint layer AF may include a perfluoropolyether (PFPE) compound. In an embodiment, for example, the anti-fingerprint layer AF may contain perfluoropolyether silane, perfluoroalkylether alkoxysilane, perfluoroalkylether copolymer, or the like. In such an embodiment where the anti-fingerprint layer AF includes the perfluoropolyether compound, the anti-fingerprint and abrasion resistance characteristics may be improved.

The anti-fingerprint layer AF may have a thickness in a range of, for example, about 5 nm to about 20 nm. In an embodiment where the anti-fingerprint layer AF has a thickness in the above range, the anti-fingerprint and abrasion resistance characteristics may be improved and the low reflection characteristics of the window WM may be effectively maintained.

The hard coating layer HC may impart physical strength to the window WM. The hard coating layer HC may have a thickness in a range of about 1 μm to about 5 μm.

The hard coating layer HC may include a photocurable resin. The photocurable resin is a polymer of a compound that causes a polymerization reaction when irradiated with light such as ultraviolet rays, and a typical resin in the art may be used. In an embodiment, for example, the photocurable resin may include a reactive acrylate oligomer, or a polyfunctional acrylate monomer.

The hard coating layer HC may further include fine particles dispersed in the photocurable resin. The fine particles dispersed in the photocurable resin may be organic or inorganic fine particles. In an embodiment, for example, the fine particles may be organic fine particles including an acrylic resin, a styrene-based resin, an epoxide resin, or a nylon resin. In addition, the fine particles may be oxide fine particle of at least one metal selected from Zr, Ti, In, Zn, Sn, Al and Sb.

Table 1 shows results obtained by evaluating the chemical resistance characteristics of the window according to an embodiment of the invention. The chemical resistance characteristics were evaluated by measuring the contact angle of deionized water with respect to the window surface in a state in which ethanol was applied to the surface of the window according to Examples. The contact angle was measured after reciprocating, on the window surface, a Minoan rubber (15 mm in diameter) with a load of 1 kg in the left-and-right direction 1000 times at 50 rotation per minute (RPM).

A window according to Example 1-1 was manufactured by applying a primer coating layer one time on the low refractive layer containing hollow silica, and then forming an anti-fingerprint layer. A method of manufacturing a window according to Example 1-2 is the same as a method of manufacturing a window according to Example 1-1, except that the primer coating layer was applied two times.

TABLE 1

| | Primer Coating Layer | Contact Angle |
|---|---|---|
| Example 1-1 | Coating one time | 60 or less |
| Example 1-2 | Coating two times | 98 or more |

Referring to Table 1, compared to the window according to Example 1-1 in which the primer coating layer was coated one time, the window according to Example 1-2 in which the primer coating layer was coated two times showed higher chemical resistance characteristics. This is because it is considered that when the primer coating layer was coated two times, the irregularities of the low refractive layer may be sufficiently planarized, and thus the adhesion with the anti-fingerprint layer may be further improved. In a case where the primer coating layer was coated two times, the primer coating layer had a thickness in a range of about 20 nm to about 40 nm.

That is, the window including the primer coating layer exhibits high chemical resistance characteristics. In addition, since the abrasion resistance characteristics have a same tendency as the chemical resistance characteristics, the window including the primer coating layer is expected to have high abrasion resistance characteristics.

As described above, in a case where the adhesion between the low refractive layer and the anti-fingerprint layer is strengthened by the primer coating layer, and thus the window may exhibit high abrasion resistance and chemical resistance characteristics. On the other hand, in a case where there is no primer coating layer, the adhesion between the low refractive layer and the anti-fingerprint layer is insufficient, and thus the window may not exhibit high abrasion resistance and chemical resistance characteristics.

Figure 9:
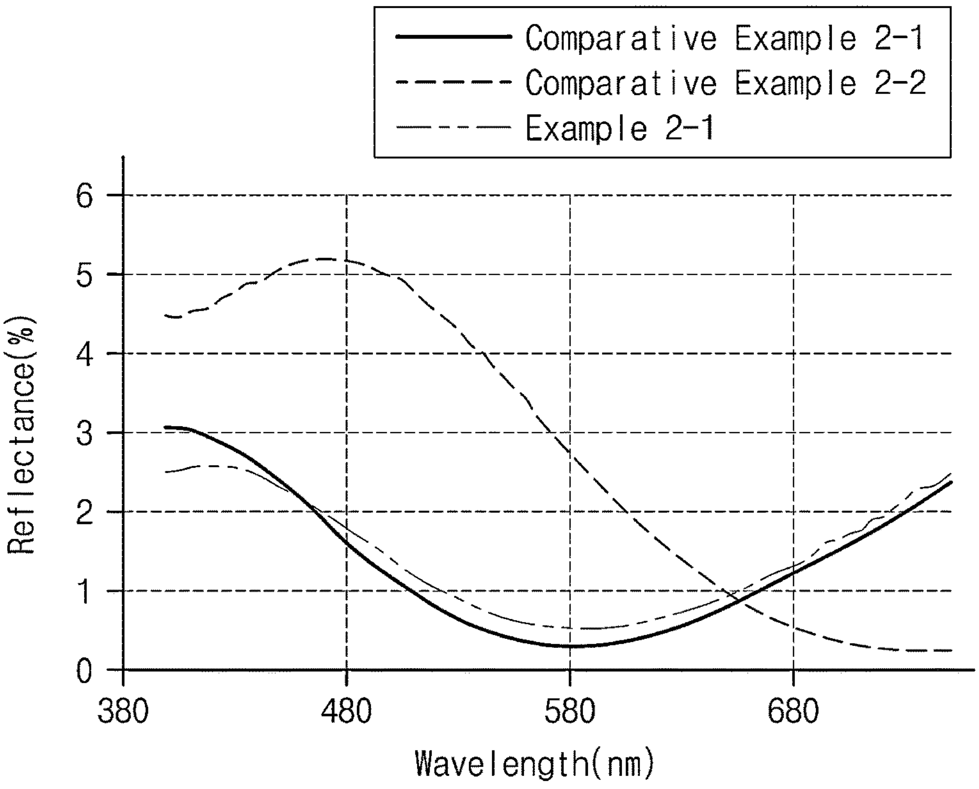
FIG. 9 is a graph showing measurement results the reflectance of a window according to an embodiment of the invention.

FIG. 9 is a graph showing measurement results of the reflectance of a window according to an embodiment of the invention. In FIG. 9, a solid line graph shows the window according to Comparative Example 2-1 not including a primer coating layer, a dotted line graph shows the window according to Comparative Example 2-2 including a primer coating layer and having a thickness of a low refractive layer of about 90 nm, and a dashed line graph shows the window according to Example 2-1 including a primer coating layer and having a thickness of about 50 nm of the low refractive layer. The refractive index and thickness of each layer are shown in Tables 2 and 3 below, respectively.

TABLE 2

| | Refractive Index (550 nm) | | | |
|---|---|---|---|---|
| | High Refractive Layer | Low Refractive Layer | Primer Coating Layer | Anti-fingerprint Layer |
| Example 2-1 | 1.673 | 1.457 | 1.46 | 1.38 |
| Comparative Example 2-1 | 1.673 | 1.422 | — | 1.38 |
| Comparative Example 2-2 | 1.673 | 1.42 | 1.46 | 1.38 |

TABLE 3

| | Thickness (nm) | | | |
|---|---|---|---|---|
| | High Refractive Layer | Low Refractive Layer | Primer Coating Layer | Anti-fingerprint Layer |
| Example 2-1 | 120 | 50 | 20 | 15 |
| Comparative Example 2-1 | 120 | 90 | — | 15 |
| Comparative Example 2-2 | 120 | 90 | 20 | 15 |

Referring to Tables 2, 3, and FIG. 9 together, it is shown that as the window according to Comparative Example 2-2 includes a primer coating layer, the thickness of the window according to Comparative Example 2-2 increases to result in a slight increase in the reflectance compared to the window of Comparative Example 2-1. The window according to Example 2-1 includes a primer coating layer, but the thickness of the low refractive layer is in a range of about 50 nm to about 80 nm, and it was confirmed that the reflectance was lowered.

Referring to Tables 1 to 3, and FIG. 9 together, the window according to an embodiment of the invention includes the primer coating layer, and thus not only exhibits high abrasion resistance characteristics and high chemical resistance characteristics as shown in Table 1 above, but also has low reflective characteristics as shown in the graph of FIG. 9 since the thickness of the low refractive layer is in a range of about 50 nm to about 80 nm.

Since a window WM according to an embodiment of the invention includes a primer coating layer SCA, the window WM may have high abrasion resistance characteristics and high chemical resistance characteristics while exhibiting low reflection characteristics.

Since a display device DD according to an embodiment of the invention includes the window WM including the primer coating layer SCA, the display device DD may have high abrasion resistance characteristics and high chemical resistance characteristics while exhibiting low reflection characteristics.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A window comprising:

a window base layer;

a high refractive layer disposed on the window base layer;

a low refractive layer including hollow silica particles and disposed on the high refractive layer, wherein the low refractive layer has an irregular upper surface; and a primer coating layer disposed directly on the irregular upper surface of the low refractive layer, wherein each of the low refractive layer and the primer coating layer has a refractive index in a range from 1.4 to 1.46, the low refractive layer has a thickness in a range from 50 nm to 80 nm, the primer coating layer includes a silane coupling agent, and the low refractive layer further includes the silane coupling agent as a binder.

2. The window of claim 1, wherein the primer coating layer has a thickness in a range from 10 nm to 40 nm.

3. The window of claim 1, wherein the hollow silica particles have a size in a range from 50 nm to 80 nm.

4. The window of claim 1, wherein a content of the hollow silica particles is greater than or equal to 60 wt % with respect to a total content of the low refractive layer.

5. The window of claim 1, wherein the high refractive layer has a thickness in a range from 50 nm to 120 nm.

6. The window of claim 1, wherein the high refractive layer has a refractive index in a range from 1.67 to 1.7.

7. The window of claim 1, further comprising:

an anti-fingerprint layer disposed on the primer coating layer.

8. The window of claim 7, wherein the anti-fingerprint layer is disposed directly on the primer coating layer.

9. The window of claim 7, wherein the anti-fingerprint layer comprises perfluoropolyether (PFPE).

10. The window of claim 1, further comprising:

a hard coating layer disposed between the window base layer and the high refractive layer.

11. A window comprising:

a window base layer;

a high refractive layer disposed on the window base layer;

a low refractive layer including hollow silica particles and disposed on the high refractive layer, wherein the low refractive layer has an irregular upper surface; and a primer coating layer disposed directly on the irregular upper surface of the low refractive layer, wherein the low refractive layer has a thickness in a range from 50 nm to 80 nm, the primer coating layer includes a silane coupling agent, and the low refractive layer further includes the silane coupling agent as a binder.

12. The window of claim 11, wherein the high refractive layer has a refractive index in a range from 1.67 to 1.7, and each of the low refractive layer and the primer coating layer has a refractive index in a range from 1.4 to 1.46.

13. The window of claim 11, wherein the primer coating layer has a thickness in a range from 10 nm to 40 nm, and the high refractive layer has a thickness in a range from 50 nm to 120 nm.

14. The window of claim 11, further comprising:

an anti-fingerprint layer disposed directly on the primer coating layer.

15. A display device comprising:

a display module including a display panel and a sensor layer disposed on the display panel; and a window disposed on the display module, wherein the window includes:

a window base layer;

a high refractive layer disposed on the window base layer;

a low refractive layer including hollow silica particles and disposed on the high refractive layer, wherein the low refractive layer has an irregular upper surface; and a primer coating layer disposed directly on the irregular upper surface of the low refractive layer, and each of the low refractive layer and the primer coating layer has a refractive index in a range from 1.4 to 1.46, the low refractive layer has a thickness in a range from 50 nm to 80 nm, the primer coating layer includes a silane coupling agent, and the low refractive layer further includes the silane coupling agent as a binder.

16. The display device of claim 15, wherein the primer coating layer has a thickness in a range from 10 nm to 40 nm.

17. The display device of claim 15, wherein the high refractive layer has a thickness in a range from 50 nm to 120 nm.

* * * * *